US011328943B2

(12) United States Patent
Kuppannan et al.

(10) Patent No.: US 11,328,943 B2
(45) Date of Patent: May 10, 2022

(54) DUAL GATE AND SINGLE ACTUATOR SYSTEM

(71) Applicant: APPLIED MATERIALS, INC., Santa Clara, CA (US)

(72) Inventors: Kumaresan Kuppannan, Bangalore (IN); Ofer Amir, Half Moon Bay, CA (US); Michael Kuchar, Georgetown, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/839,360

(22) Filed: Apr. 3, 2020

(65) Prior Publication Data
US 2021/0313204 A1 Oct. 7, 2021

(51) Int. Cl.
*H01L 21/67* (2006.01)
*F16K 51/02* (2006.01)
*H01L 21/673* (2006.01)
*F16K 3/18* (2006.01)

(52) U.S. Cl.
CPC ........ *H01L 21/67201* (2013.01); *F16K 3/188* (2013.01); *F16K 51/02* (2013.01); *H01L 21/67373* (2013.01); *H01L 21/67376* (2013.01)

(58) Field of Classification Search
CPC ......... H01L 21/67201; H01L 21/67373; H01L 21/67376; H01L 21/67196; F16K 3/188; F16K 3/18; F16K 3/16
See application file for complete search history.

(56) References Cited

U.S. PATENT DOCUMENTS

| 6,095,741 | A | * | 8/2000 | Kroeker ............ H01L 21/67126 414/217 |
| 6,347,918 | B1 | | 2/2002 | Blahnik |
| 6,561,483 | B2 | * | 5/2003 | Nakagawa ............... F16K 3/188 251/175 |
| 6,561,484 | B2 | * | 5/2003 | Nakagawa ............... F16K 3/188 251/175 |
| 6,601,824 | B2 | | 8/2003 | Kroeker |
| 7,059,583 | B2 | | 6/2006 | Tomasch |

(Continued)

FOREIGN PATENT DOCUMENTS

| JP | 2002174350 A | 6/2002 |
| JP | 2009115242 A | 5/2009 |

(Continued)

OTHER PUBLICATIONS

PCT Notification of Transmittal Of The International Search Report And The Written Opinion Of The International Searching Authority for PCT Application No. PCT/US2021/025580, dated Jul. 23, 2021, 11 pages.

*Primary Examiner* — Glenn F Myers
(74) *Attorney, Agent, or Firm* — Lowenstein Sandler LLP

(57) ABSTRACT

Disclosed is a wafer processing system, a dual gate system, and methods for operating these systems. The dual gate system may have a first gate, a second gate, a gate connector coupled to the first gate and to the second gate, and actuator coupled to the gate connector. The actuator is configured to seal the first gate against a first slot or open the first slot via vertical motion. The actuator is also configured to seal the second gate against a second slot or open the second slot via a combination of vertical motion and horizontal motion.

16 Claims, 6 Drawing Sheets

(56) References Cited

U.S. PATENT DOCUMENTS

| | | | |
|---|---|---|---|
| 7,086,638 B2* | 8/2006 | Kurita | F16K 3/188 |
| | | | 251/175 |
| 7,128,305 B2 | 10/2006 | Tomasch | |
| 2017/0309457 A1* | 10/2017 | Furukawahara | F16K 3/029 |

FOREIGN PATENT DOCUMENTS

| | | |
|---|---|---|
| KR | 20080081533 A | 9/2008 |
| KR | 20160119643 A | 10/2016 |

* cited by examiner

DUAL GATE AND SINGLE ACTUATOR SYSTEM

FIELD OF THE DISCLOSURE

Embodiments of the present disclosure relate generally to methods and to a system for processing wafers. More specifically, the present disclosure relates to a dual gate system in which a single actuator manipulates two gates.

BACKGROUND OF THE DISCLOSURE

In electronic device manufacturing, wafers (e.g., silicon-containing wafers, silicon-containing plates) may be moved about manufacturing facilities and within manufacturing equipment tools, for example from a factory interface to a load lock chamber, from a load lock chamber to a transfer chamber, from a transfer chamber to a processing chamber, and the like. In these movements, wafers are transferred through ports that are positioned between adjacent chambers. The ports typically house two gate systems, where each gate is coupled to its designated actuator for manipulating its corresponding gate. Individual actuators for each gate take up additional space, use additional grease, require individual maintenance, and generate additional contamination as compared to a single actuator for manipulating both gates.

SUMMARY OF THE DISCLOSURE

In certain embodiments, the instant disclosure is directed to a dual gate system. In embodiments, the dual gate system includes a first gate, a second gate, a gate connector coupled to the first gate and to the second gate, and an actuator coupled to the gate connector. The first gate is configured to form a first seal against a first slot. The second gate is configured to form a seal against a second slot that is opposite the first slot. In embodiments, the actuator is configured to seal the first gate against the first slot by moving the gate connector, the first gate, and the second gate together to an intermediate position, and then moving the gate connector, the first gate, and the second gate together vertically to a first sealed position. In embodiments, the actuator is configured to seal the second gate against the second slot by moving the gate connector, the first gate, and the second gate together to an intermediate position, and then moving the gate connector, the first gate, and the second gate together horizontally to a second sealed gate position.

In certain embodiments, the instant disclosure is directed to a method for operating the dual gate system disclosed herein. The method includes moving together a first gate, a second gate, and a gate connector that is coupled to the first gate and to the second gate from an open position to an intermediate position. Then, the method further includes moving together the gate connector, the first gate, and the second gate vertically to a first sealed gate position or moving together the gate connector, the first gate, and the second gate horizontally to a second sealed gate position. The first sealed gate position includes a first seal against a first slot on a first side of a housing containing the first gate, the second gate, and the gate connector. The second sealed gate position includes a second seal against a second slot on a second side of the housing that is opposite the first side of the housing.

In certain embodiments, the instant disclosure is directed to a wafer processing system that includes a first station, a second station adjacent to the first station, and a port positioned between the first station and the second station. The port includes a housing and a dual gate system housed within the housing. In embodiments, the housing has a first side and a second side that is opposite the first side. The housing further includes a first slot at the first side and a second slot at the second slot, wherein objects are transferable between the first station and the second station through the port via the first slot and the second slot. In embodiments, the dual gate system includes a first gate, a second gate, a gate connector coupled to the first gate and to the second gate, and an actuator coupled to the gate connector. The first gate is configured to form a first seal against the first slot. The second gate is configured to form a seal against the second slot. In embodiments, the actuator is configured to seal the first gate against the first slot by moving the gate connector, the first gate, and the second gate together to an intermediate position, and then moving the gate connector, the first gate, and the second gate together vertically to a first sealed position. In embodiments, the actuator is configured to seal the second gate against the second slot by moving the gate connector, the first gate, and the second gate together to an intermediate position, and then moving the gate connector, the first gate, and the second gate together horizontally to a second sealed gate position.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
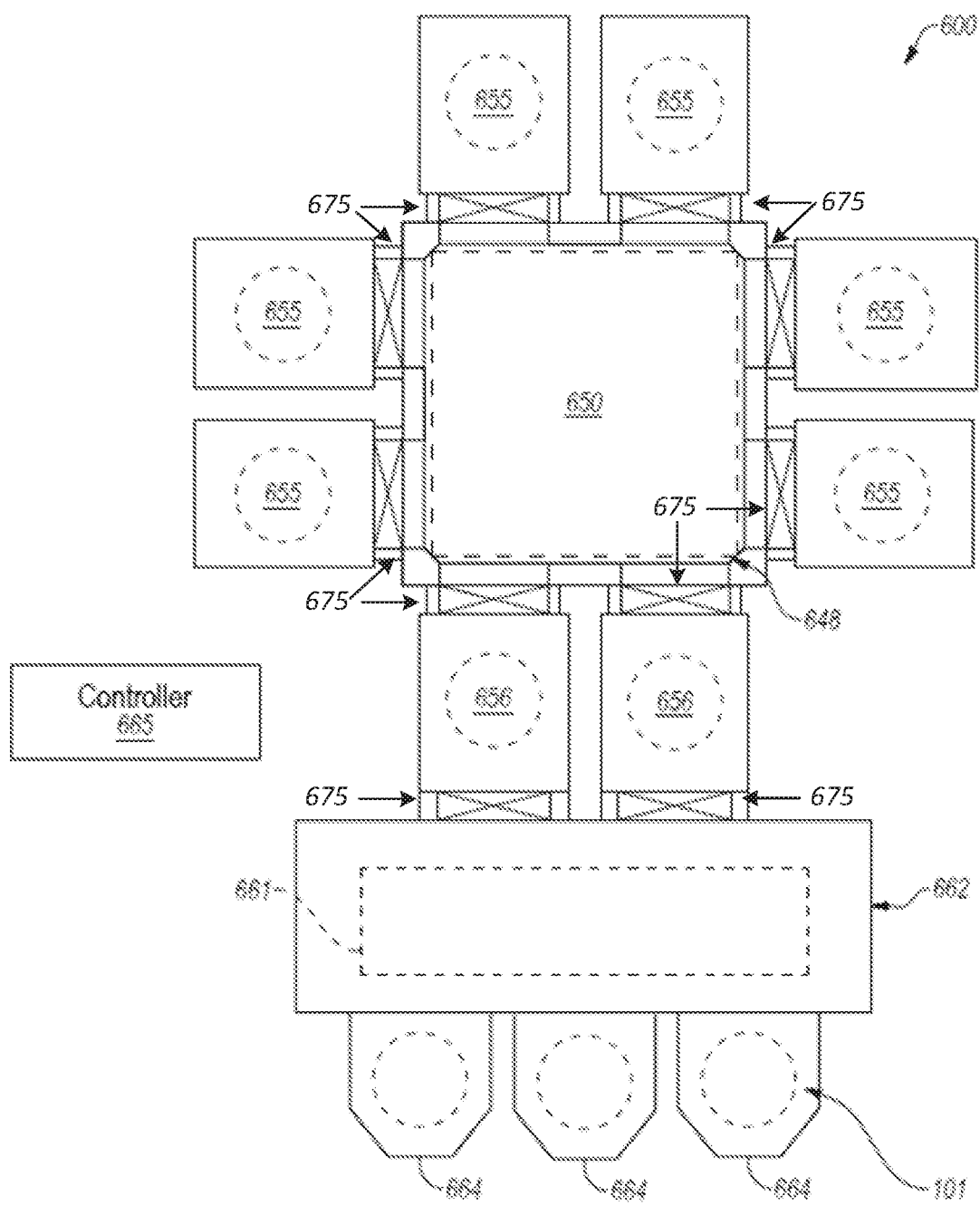
FIG. 1 illustrates a top schematic of a wafer processing system in accordance with embodiments of the present disclosure.

During wafer processing, wafers are transferred between multiple chambers, for example from a factory interface into a load lock chamber, from a load lock chamber into a transfer chamber, and from a transfer chamber to a processing chamber, to name a few. During such transfers, wafers are moved through ports that are positioned between adjacent chambers. The ports typically house two gate systems, where each gate is coupled to its designated actuator used to manipulate its corresponding gate. A design that includes a single actuator for manipulating both gates may beneficially reduce the size and thickness of the ports used between chambers, reduce the amount of grease used and the contamination that is associated with such use (from the grease or from particle formation), and increase reliability due to operation of a reduced number of tools.

A wafer processing system, a port (such as a chamber port), and an operational method thereof are described herein. In certain embodiments, the wafer processing system includes a first station and a second station adjacent to the first station. The wafer processing system may further include a port positioned between the first station and the second station.

The port may include a housing and a dual gate system housed within the housing. The housing may have a first side and a second side that is opposite the first side. The housing may further include a first slot at the first side and a second slot at the second side, wherein objects are transferrable between the first station and the second station through the port via the first slot and the second slot.

The dual gate system may include a first gate, a second gate, a gate connector, and an actuator coupled to the gate connector. The first gate may be configured to form a first seal against the first slot. The second gate may be configured to form a second seal against the second slot. The gate connector may be coupled to the first gate and to the second gate. The first and the second gate may each be removeable from the gate connector. The actuator may include an actuator end-effector for manipulating the movement of the gate connector, the first gate, and the second gate in response to an input signal to the actuator. The input signal to the actuator could be pneumatic, electric, or another suitable input signal.

The actuator may be configured to seal the first gate against the first slot by moving the gate connector, the first gate, and the second gate together to an intermediate position and then moving the gate connector, the first gate, and the second gate together vertically to a first sealed position. The actuator may also be configured to seal the second gate against the second slot by moving the gate connector, the first gate, and the second gate together to the intermediate position, and then moving the gate connector, the first gate, and the second gate together horizontally to a second sealed gate position.

In an embodiment, the actuator is configured to close the first gate by moving the gate connector, the first gate, and the second gate together in an upward direction to the first sealed gate position. In that embodiment, the upward movement of the first gate to the first sealed gate position causes one or more o-ring on at least one of the first gate or the first side to become compressed between the first gate and the first side. In that embodiment, to open the sealed first gate the actuator is configured to move the gate connector, the first gate, and the second gate together downward from the first sealed gate position, past the intermediate position, to an open gate position. In the open gate position, both the first gate and the second gate are open and objects may be transferred therethrough from a first station to an adjacent second station separated with the port.

In an embodiment, the actuator is configured to close the second gate by moving the gate connector, the first gate, and the second gate together in a horizontal direction towards the second side to the second sealed gate position. In that embodiment, the horizontal movement of the second gate to the second sealed gate position causes one or more o-ring on at least one of the second gate or the second side to become compressed between the second gate and the second side. In that embodiment, to open the sealed second gate the actuator is configured to move the gate connector, the first gate, and the second gate together horizontally from the second sealed gate position to an intermediate position, and to subsequently move the gate connector, the first gate, and the second gate downward to an open gate position. In the open gate position, both the first gate and the second gate are open and objects may be transferred therethrough from a first station to an adjacent second station separated with the port.

In certain embodiments, the operational method described herein includes moving together a first gate, a second gate, and a gate connector coupled to the first gate and the second gate from an open position to an intermediate position. Thereafter, the operational method may further include either moving together the gate connector, the first gate, and the second gate vertically to a first sealed gate position or moving together the gate connector, the first gate, and the second gate to a second the sealed gate position.

In an embodiment, the first sealed gate position comprises a first seal against a first slot on a first side of a housing containing the first gate, the second gate, and the gate connector. In this embodiment, the operational method may further comprise compressing one or more o-ring on at least one of the first gate or the first side between the first gate and the first side at the first sealed gate position. In this embodiment, the operational method may further comprise moving together the gate connector, the first gate, and the second gate downward from the first sealed gate position, past the intermediate position, to an open gate position, wherein both the first gate and the second gate are open in the open gate position.

In embodiments, the second sealed gate position comprises a second seal against a second slot on a second side of the housing containing the first gate, the second gate, and the gate connector. In this embodiment, the operational method may further comprise compressing one or more o-ring on at least one of the second gate or the second side between the second gate and the second side at the second sealed gate position. In this embodiment, the operational method may further comprise moving together the gate connector, the first gate, and the second gate horizontally from the second sealed gate position to the intermediate position, and subsequently moving together the gate connector, the first gate, and the second gate downward to an open gate position, wherein both the first gate and the second gate are open in the open gate position.

In an exemplary embodiment, the first station may be a transfer chamber and the second station may be a processing chamber. During regular processing, wafers may be transferred from the transfer chamber to the processing chamber through a first slot in a first side separating the transfer chamber from the port and through a second slot in a second side separating the processing chamber from the port. During wafer transfer between the transfer chamber and the processing chamber, the gate connector, the first gate, and the second gate may be in an open position. During processing, after a wafer is transferred from a transfer chamber into a processing chamber, the gate connector, the first gate, and the second gate may move together vertically from an open position to an intermediate position. Thereafter, the gate connector, the first gate, and the second gate may move together horizontally to a second sealed gate position in which the second gate seals against the second slot on the second side separating the processing chamber from the port. The movement of the gate connector, the first gate, and the second gate may be controlled by an actuator. The second gate in this example may be an L-motion gate. The L-motion gate may be used to seal the processing chamber during wafer processing. In the second sealed gate position, the first gate is not being used and may be removed for servicing.

After a certain number of hours of operation of the processing chamber or in accordance with a servicing schedule, the processing chamber may be ready to be serviced. For servicing the processing chamber, the gate connector, the first gate, and the second gate may move together to a first sealed gate position in which the first gate seals against the first slot on the first side separating the transfer chamber from the port. To reach the first sealed gate position from an open position, the gate connector, the first gate, and the second gate move together vertically from an open position to an intermediate position. Subsequently, the gate connector, the first gate, and the second gate move together vertically again from the intermediate position to the first sealed gate position. The movement of the gate connector, the first gate, and the second gate may be controlled by an actuator. The first gate in this example may be a vertical motion gate. In the first sealed gate position, the second gate is not being used and may be removed for servicing. During this time, the processing chamber may also be serviced.

The exemplary embodiment hereinabove was described with respect to a system of a processing chamber and a transfer chamber, where the processing chamber may be sealed (i.e., separated from the port) with an L-motion type gate and the transfer chamber may be sealed (i.e., separated from the port) with a vertical motion type gate. However, this exemplary embodiment should not be construed as limiting. The dual gate system may be used in ports between any adjacent stations in a wafer processing system, such as, front opening unified pods (FOUP), side storage pod (SSP), load lock, transfer chamber, factory interface, processing chamber, vacuum storage buffer, and the like.

Additionally, the positioning of the gate that is moveable in a vertical and then horizontal motion to seal should not be construed as limited, so long as one gate is moveable in this manner and the other gate is moveable in a vertical motion. In one embodiment, the L-motion type gate may separate the processing chamber from the port and the vertical motion type gate may separate the transfer chamber from the port. In another embodiment, the L-motion type gate may separate the transfer chamber from the port and the vertical motion type gate may separate the processing chamber from the port. Generally, an L-motion type gate generates less shear upon sealing and would be the preferred gate for gates that are utilized more frequently during wafer processing.

Some exemplary actuation mechanisms that may be used to implement vertical and/or horizontal movement of the dual gate system may include, without limitations, a single stroke pneumatic cylinder, a servo or stepper motor, a dual stroke pneumatic cylinder, and so on.

As used herein, the singular forms "a," "an," and "the" include plural references unless the context clearly indicates otherwise. Thus, for example, reference to "a wafer" includes a single wafer as well as two or more wafers, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

As used herein, the term "vertically" in connection with a movement direction refers to movement upward and/or downward along a Y axis depicted in FIGS. 2-5.

As used herein, the term "horizontally" in connection with a movement direction refers to movement sideways, such as to the right or to the left, along an X axis depicted in FIGS. 2-5.

As used herein, the term "station" refers to a chamber in which objects transferred through a wafer processing system, such as a wafers, may be stored temporarily. A station, as used herein, may be separated from other portions of the wafer processing system with at least one gate. Examples of stations include a front opening unified pod (FOUP), a load lock, a load port, a process chamber, a transfer chamber, and a factory interface.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

FIG. 1 illustrates a top schematic of a wafer processing system 600 in accordance with embodiments of the present disclosure. Wafer processing system 600 may include a factory interface 662 (also referred to as "equipment front end module (EFEM)"), a main frame 648 (also referred to as a transfer chamber), one or more processing chambers 655, and one or more load lock chambers 656 according to embodiments described herein. Main frame 648 may be connected to factory interface 662 via the one or more load lock chambers 656. Wafer carriers 664 may be detachably connected to a front wall of the factory interface 662. Factory interface 662 may include a factory interface robot 661 for moving wafer 101 (shown dotted for illustration purposes) and/or other objects (such as process kit ring, etc.) between wafer carriers 664 and load lock chambers 656. For instance, factory interface 662 may include one or more load ports, each of which may receive a wafer carrier 664. An overhead track (OHT) may drop a front opening unified pod (FOUP) onto a load port. Factory interface robot 661 may pick wafer 101 from the FOUP and may optionally align wafer 101 in an aligner (not shown). Subsequently, factory interface robot 661 may place wafer 101 in load lock chamber 656. Thereafter, main frame robot 650 (located in main frame 648) may pick wafer 101 from at least one of load lock chambers 656 and hand wafer 101 to at least one of the one or more processing chambers 655.

As the manufacturing processes progress, the factory interface robot 661 and the main frame robot 650, working in tandem, move wafers 101 and/or other objects between the wafer carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within process chambers 655.

After processing in at least one of the one or more processing chambers 655 is complete, processed wafer 101 may be picked by main frame robot 650 and handed over to at least one of load lock chambers 656. At least one of load lock chambers 656 may pump its pressure up to atmospheric pressure followed by the processed wafer 101 being picked by the factory interface robot 661 and placed back into the FOUP. After all wafers from wafer carriers 664 are processed, the OHT (not shown) may pick the FOUP and drop it with a different tool as per the designed manufacturing process.

Figure 2:
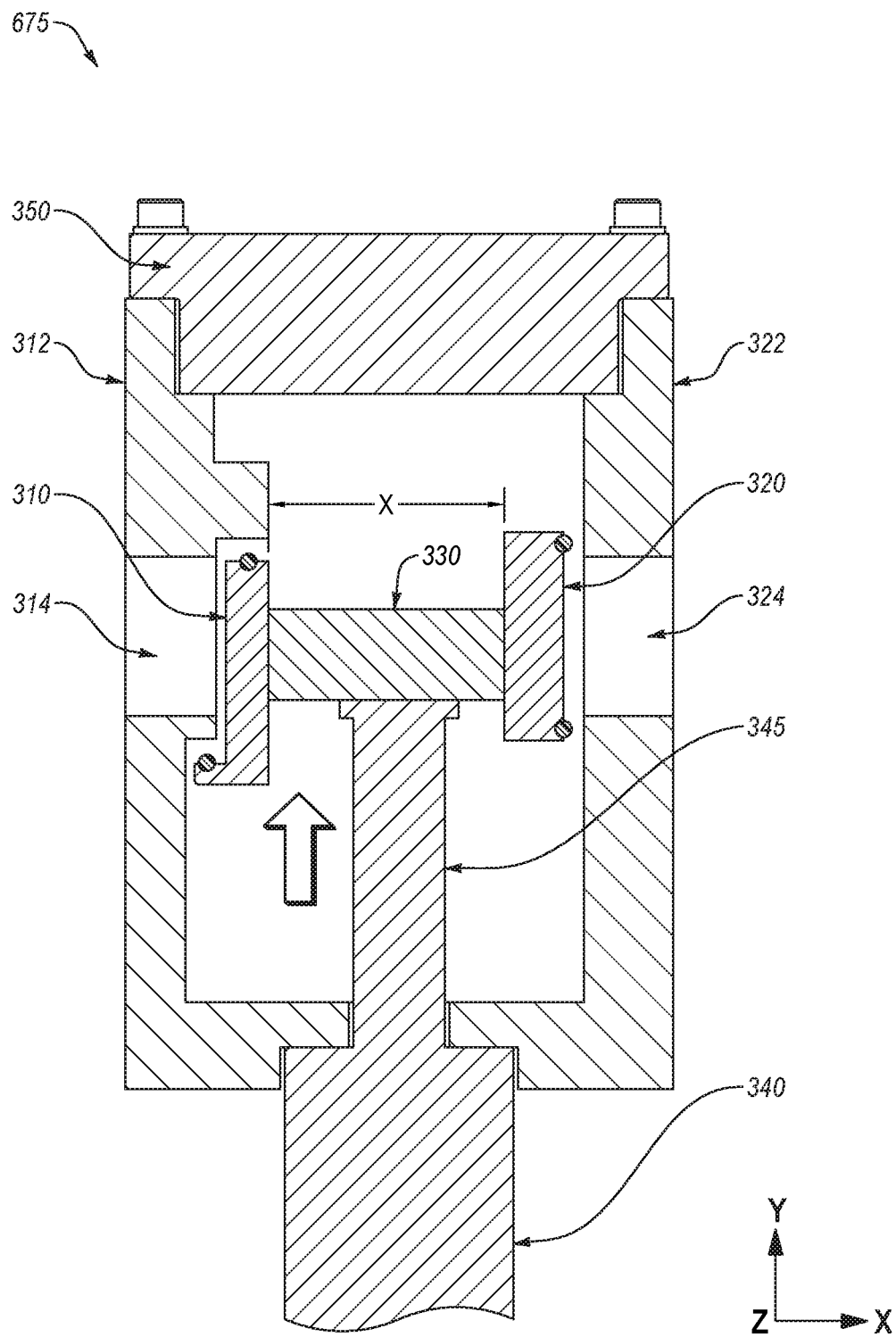
FIG. 2 illustrates a simplified cross-sectional side view of a dual gate system in accordance with embodiments of the present disclosure.

Wafer 101 and/or other objects are transferred between one station to an adjacent station (e.g., between transfer chamber 648 to processing chamber 655, between load lock chamber 656 and transfer chamber 648, between factory interface 662 and load lock chamber 656, and the like) via dual gate systems, described in further detail with respect to FIG. 2, that are housed in ports 675.

Some ports between two adjacent stations may include a housing and a dual gate and dual actuator system housed within the housing. The dual gate and dual actuator system may include a first gate coupled to a first actuator that is configured to move the first gate from an open position to a first sealed gate position. The dual gate and dual actuator system may further include a separate second gate coupled to a second actuator (separate from the first actuator) that is configured to move the second gate from an open position to a second sealed gate position. In this configuration, each actuator, manipulates its designated gate.

Having two actuators with each manipulating a single gate, as opposed to having a single actuator that could manipulate both gates, takes up more space, uses up more grease, generates more contamination, and involves more maintenance. Accordingly, some ports in wafer processing system 600 of FIG. 1 include dual gates actuated by a single actuator. The instant disclosure is directed in certain embodiments to a dual gate system in which a single actuator manipulates two gates. Such embodiments beneficially reduce the number of actuators used, reduce the amount of grease used, reduce the amount of contamination associated with operating two actuators as opposed to one (e.g., number of particles generated by two actuators as opposed to one, the amount of grease used by two actuators as opposed to one), increase reliability, and reduce space uptake since one actuator takes less space than a single actuator.

FIG. 2 illustrates a simplified cross-sectional side view of a dual gate system in accordance with embodiments of the present disclosure. As shown in FIG. 2, port 675, according to embodiments, includes a housing 350 and a dual gate system housed within the housing 350.

In embodiments, the housing 350 has a first side 312 and a second side 322 that is opposite the first side. The housing further includes a first slot 314 at the first side 312 and a second slot 324 at the second side 322. Objects are transferable between a first station and a second station (e.g., between factory interface 662 and load lock 656, between load lock 656 and transfer chamber 648, or between transfer chamber 648 and processing chamber 655) through the port 675 via the first slot 314 and the second slot 324.

In embodiments, the dual gate system includes a first gate 310, a second gate 320, a gate connector 330 coupled to the first gate 310 and to the second gate 320, and an actuator 340 coupled to the gate connector 330. The actuator 340 may further include an actuator shaft 345 coupled to the gate connector 330. The actuator shaft 345 may also be referred to herein as the actuator end effector configured to manipulate the first gate 310, the second gate 320, and the gate connector 330 in response to an input signal to the actuator 340 (e.g., a pneumatic input signal, an electric input signal, or another input signal). The first gate 310 and the second gate 320 may both be removable from the gate connector 330. The gate connector may be compact in dimensions (i.e., x distance between the first gate 310 and the second gate 320 will be minimized) while still providing sufficient room for an operator and/or a robot to readily access the port 675 and remove at least one of the first gate 310 or the second gate 320 (or to place at least one of the first gate 310 or the second gate 320 after it has been replaced and/or cleaned and/or serviced).

Figure 3:
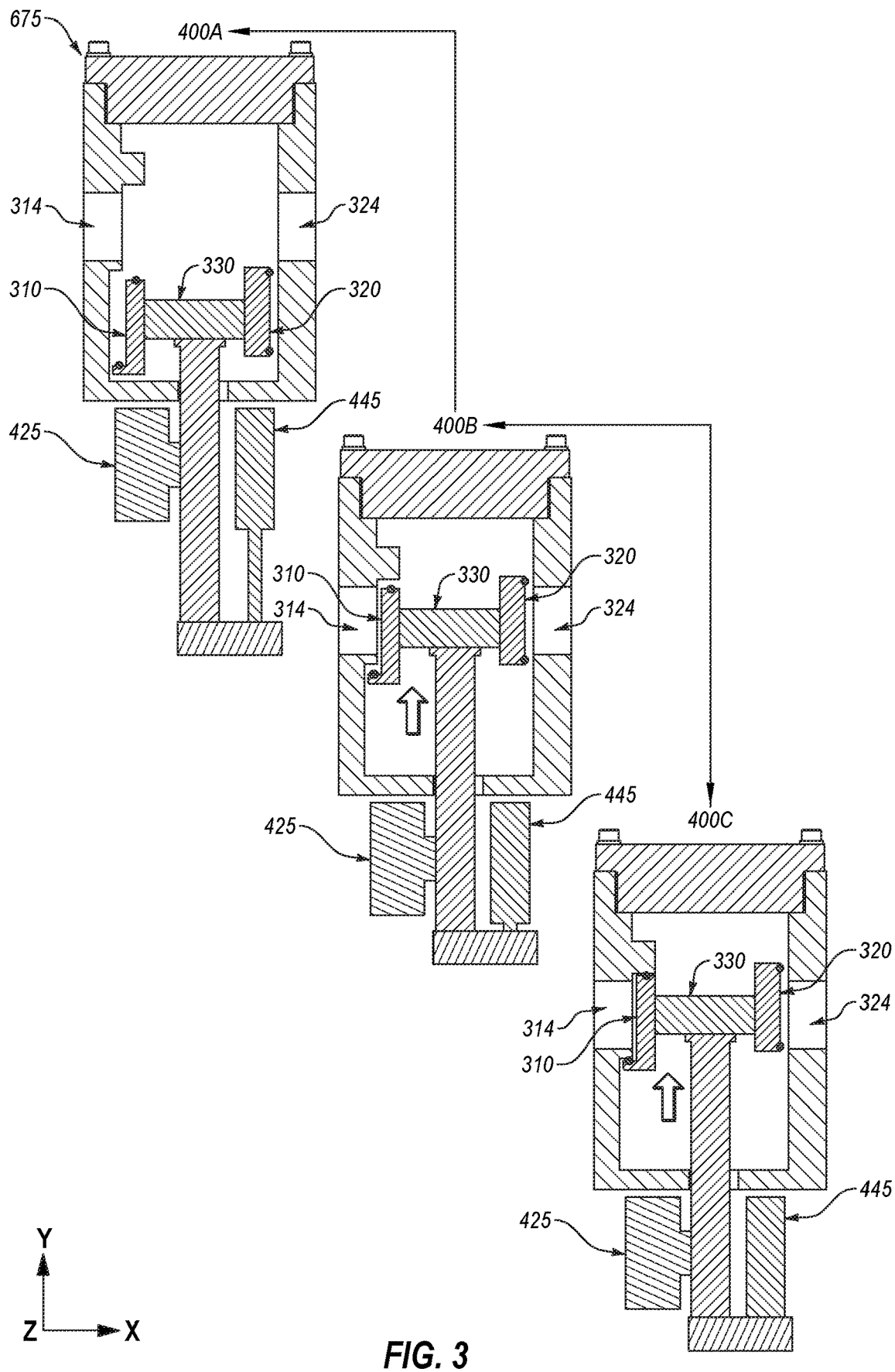
FIG. 3 illustrates simplified schematic of the operational method of the dual gate system in accordance with an embodiment.

The first gate 310 is configured to form a first seal against the first slot 314 as described in further detail with respect to FIG. 3. In certain embodiments, the actuator 340 is configured to seal the first gate 310 against the first slot 314 by moving the gate connector 330, the first gate 310, and the second gate 320 together vertically from an open position (e.g., 400A in FIG. 3 and FIG. 4) to an intermediate position (e.g., 400B in FIG. 3 and FIG. 4), and then moving the gate connector 330, the first gate 310, and the second gate 320 together vertically to a first sealed position (e.g., 400C in FIG. 3).

In an embodiment, the actuator 340 is configured to close the first gate 310 by moving the gate connector 330, the first gate 310, and the second gate 320 together in an upward direction to the first sealed position (e.g., 400C in FIG. 3). The upward movement of the first gate 310 to the first sealed position 400C causes an o-ring on the first gate 310 (not shown) and/or an o-ring on the first side 312 (not shown) to become compressed between the first gate 310 and the first side 312.

In an embodiment, in order to open the a sealed first gate 310, the actuator 340 is configured to move the gate connector 330, the first gate 310, and the second gate 320 together in a downward direction from the first sealed position (e.g., 400C), past the intermediate position (e.g., 400B), to an open gate position (e.g., 400A). In the open gate position, both the first gate 310 and the second gate 320 are open and objects, such as wafers, maybe transferred between adjacent stations that are separated by the port 675.

Figure 4:
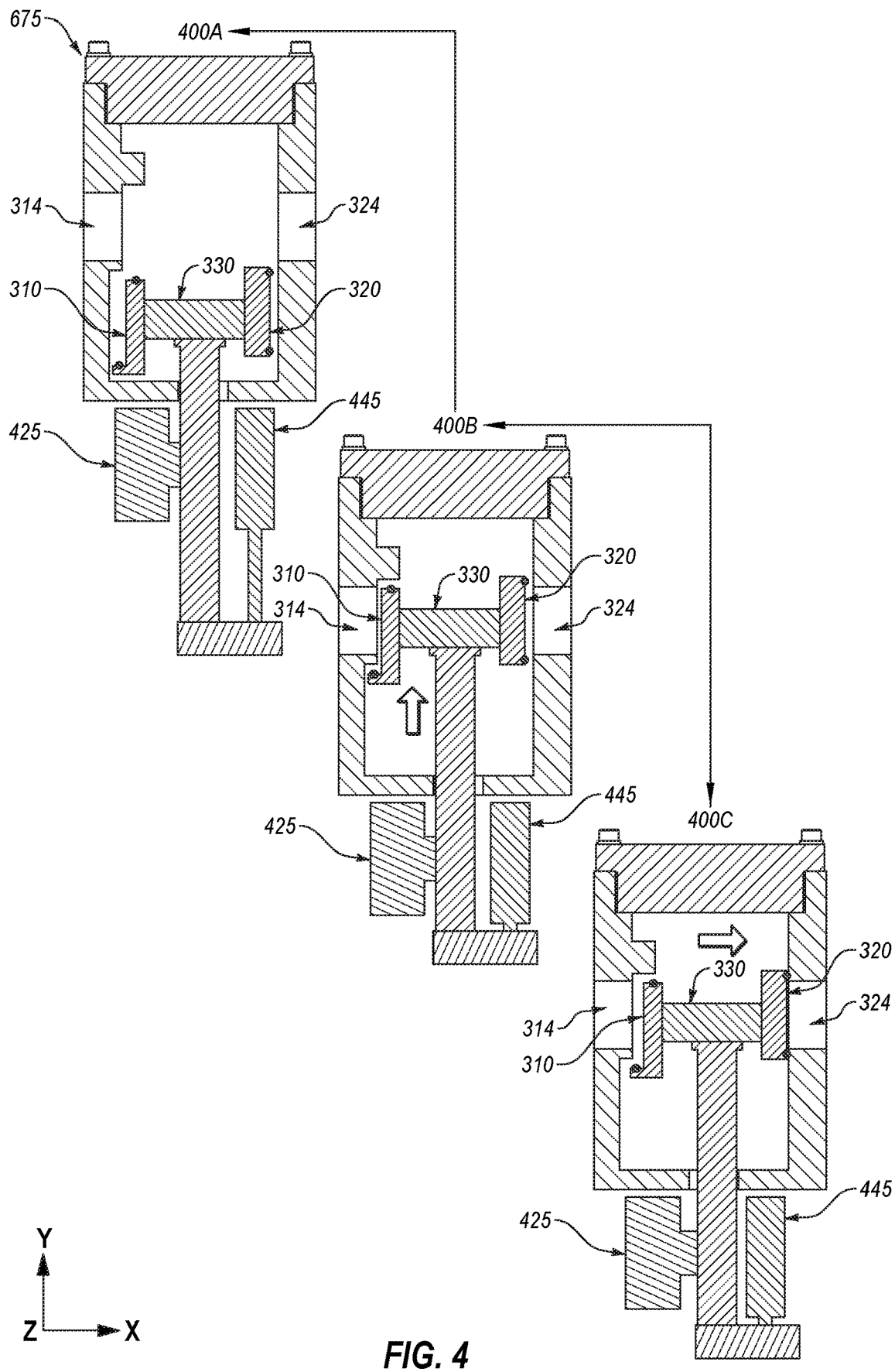
FIG. 4 illustrates simplified schematic of the operational method of the dual gate system in accordance with an embodiment.

The second gate 320 is configured to form a second seal against the second slot 324 as described in further detail with respect to FIG. 4. In certain embodiments, the actuator 340 is configured to seal the second gate 320 against the second slot 324 by moving the gate connector 330, the first gate 310, and the second gate 320 together vertically upwards from an open position (e.g., 400A in FIG. 3 and FIG. 4) to an intermediate position (e.g., 400B in FIG. 3 and FIG. 4), and then moving the gate connector 330, the first gate 310, and the second gate 320 together horizontally to a second sealed gate position (e.g., 500C in FIG. 4).

In an embodiment, the actuator 340 is configured to close the second gate 320 by moving the gate connector 330, the first gate 310, and the second gate 320 together in a horizontal direction towards the second side 322 to the second sealed position (e.g., 500C in FIG. 4). The horizontal movement of the second gate 320 to the second sealed position (e.g., 500C) causes an o-ring on the second gate 320 (not shown) and/or an o-ring on the second side 322 (not shown) to become compressed between the second gate 320 and the second side 322.

In an embodiment, in order to open the a sealed second gate 320, the actuator 340 is configured to move the gate connector 330, the first gate 310, and the second gate 320 together in a horizontal direction from the second sealed position (e.g., 500C), past the intermediate position (e.g., 400B), and to subsequently move the gate connector 330, the first gate 310, and the second gate 320 together in a downward vertical direction to an open gate position (e.g., 400A). In the open gate position, both the first gate 310 and the second gate 320 are open and objects, such as wafers, maybe transferred between adjacent stations that are separated by the port 675.

Each of the adjacent stations separated by the port 675 may be selected from the group consisting of a load lock, a transfer chamber, a processing chamber, a front opening unified pod (FOUP), a side storage pod (SSP), a factory interface, and a vacuum storage buffer. In one embodiment, the first station is a transfer chamber and the second station is a processing chamber (or vice versa). In one embodiment, the first station is a load lock and the second station is a transfer chamber (or vice versa). In one embodiment, the first station is FOUP and the second station is a load lock (or vice versa).

In certain embodiments, the adjacent stations separated by port 675 are both maintained at a common pressure (such as both at vacuum or both at atmospheric pressure). When both adjacent stations are at a common pressure, the first gate 310, the second gate 320, and the gate connecter 330 are together in any of the following positions: open gate position 400A, intermediate position 400B, first sealed position 400C, or second sealed position 500C. In other embodiments, the adjacent stations separated by port 675 have different pressures. For instance, one station may be maintained at vacuum, and the other adjacent station may be cycled between vacuum and atmospheric pressure. When the two adjacent stations have different pressures, the first gate 310, the second gate 320, and the gate connecter 330 are together in one of the following positions first sealed position 400C or second sealed position 500C.

Figure 5:
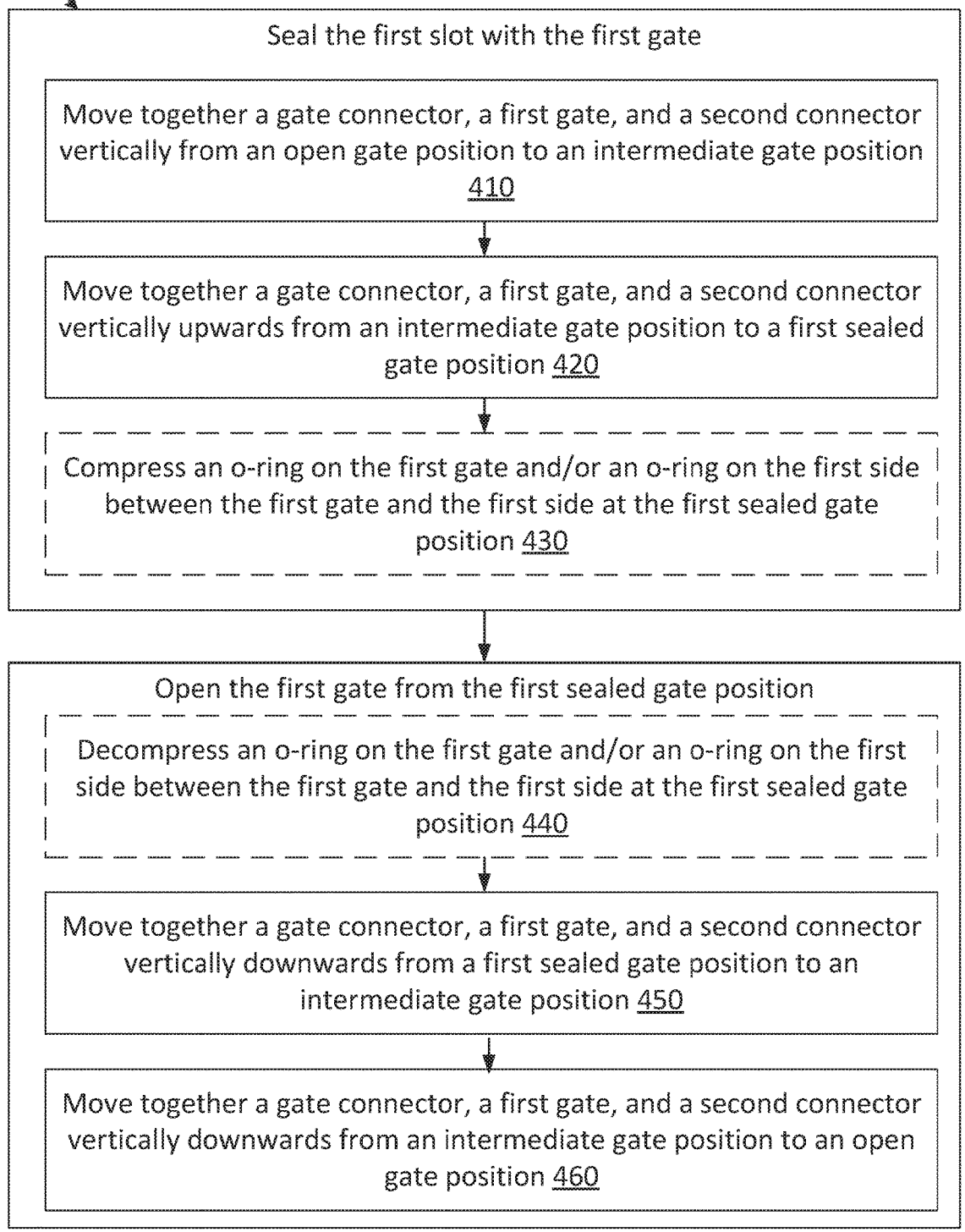
FIG. 5 is a flow chart of a method for operating a dual gate system in accordance with embodiments of the present disclosure.

FIG. 3 illustrates a simplified schematic of the operational method 400 of the dual gate system in accordance with an embodiment. FIG. 5 is a flow chart of method 400 for operating a dual gate system in accordance with embodiments of the present disclosure.

To seal the first slot with the first gate, method 400 includes, in certain embodiments, moving together a first gate 310, a second gate 320, and a gate connector 330 coupled to the first gate 310 and to the second gate 320 from an open gate position 400A to an intermediate position 400B (410 in FIG. 5). In embodiments, the movement from open gate position 400A to an intermediate position 400B is in a vertical direction upwards.

Thereafter, in certain embodiments, method 400 includes moving together the first gate 310, the second gate 320, and the gate connector 330 in a vertical direction upwards from the intermediate position 400B to a first sealed gate position 400C (420 in FIG. 5). In embodiments, the first sealed gate position 400C includes a first seal against a first slot 314 on a first side 312 of housing 350 (which contains the first gate 310, the second gate 320, and the gate connector 330).

Method 400 further includes, in certain embodiments, optionally compressing an o-ring on the first gate 310 (not shown) and/or an o-ring on the first side 312 (not shown) between the first gate 310 and the first side 312 at the first sealed gate position 400C (430 in FIG. 5).

To open the gate from the first sealed gate position, method 400 further includes, in certain embodiments, moving together the gate connector 330, the first gate 310, and the second gate 320 vertically downwards from the first sealed gate position 400C, past the intermediate position 400B (450 in FIG. 5), to an open gate position 400A (460 in FIG. 5), where both the first gate 310 and the second gate 320 are open. In this embodiment, method 400 may further include optionally decompressing an o-ring on the first gate 310 (not shown) and/or an o-ring on the first side 312 (not shown) prior to moving the gate connector 330, the first gate 310, and the second gate 320 downward from the first sealed gate position 400C (440 in FIG. 5).

In certain embodiments, at the open position 400A, a horizontal actuator 425, that is configured to provide horizontal motion to the first gate 310, second gate 320, and gate connector 330, is retracted. At the open position 400A, a vertical actuator 445, that is configured to provide vertical motion to the first gate 310, second gate 320, and gate connector 330, is extended. At the intermediate position 400B, the horizontal actuator 425 is still retracted and the vertical actuator 445 is in the middle (i.e., between an extended position and a retracted position). At the first sealed gate position 400C, the horizontal actuator 425 is retracted and the vertical actuator 445 is retracted.

Figure 6:
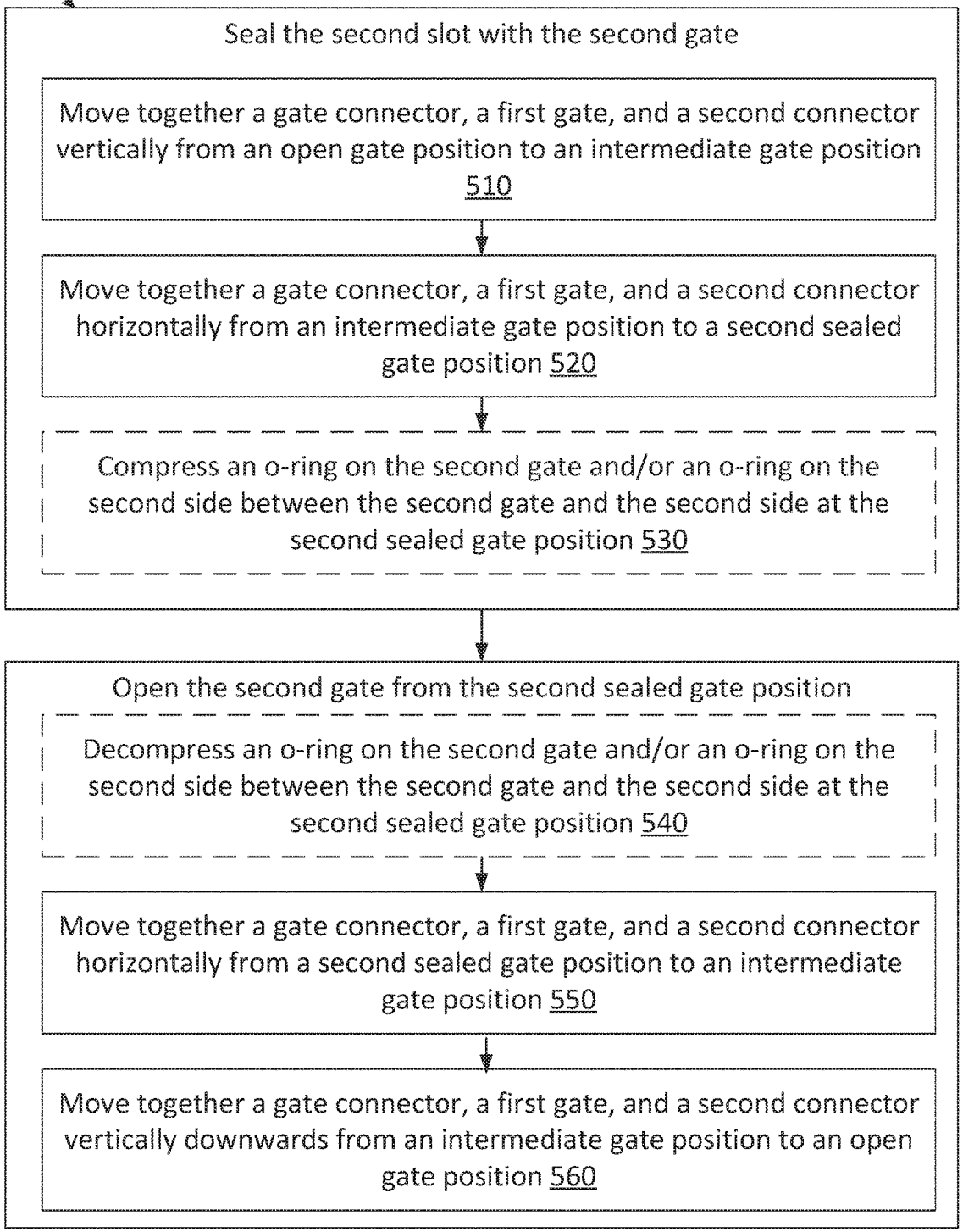
FIG. 6 is a flow chart of a method for operating a dual gate system in accordance with embodiments of the present disclosure.

FIG. 4 illustrates simplified schematic of the operational method 500 of the dual gate system in accordance with an embodiment. FIG. 6 is a flow chart of method 500 for operating a dual gate system in accordance with embodiments of the present disclosure.

To seal the second slot with the second gate, method 500 includes, in certain embodiments, moving together a first gate 310, a second gate 320, and a gate connector 330 coupled to the first gate 310 and to the second gate 320 from an open gate position 400A to an intermediate position 400B (510 in FIG. 6 and same as 410 in FIG. 5). In embodiments, the movement from open gate position 400A to an intermediate position 400B is in a vertical upward direction.

Thereafter, in certain embodiments, method 500 includes moving together the first gate 310, the second gate 320, and the gate connector 330 in a horizontal direction from the intermediate position 400B to a second sealed gate position 500C (520 in FIG. 6). In embodiments, the second sealed gate position 500C includes a second seal against a second slot 324 on a second side 322 that is opposite of first side 312 of housing 350 (which contains the first gate 310, the second gate 320, and the gate connector 330).

Method 500 further includes, in certain embodiments, compressing an o-ring on the second gate 320 (not shown) and/or an o-ring on the second side 322 (not shown) between the second gate 320 and the second side 322 at the second sealed gate position 500C (530 in FIG. 6).

To open the gate from the second sealed gate position, method 500 further includes, in certain embodiments, moving together the gate connector 330, the first gate 310, and the second gate 320 horizontally from the second sealed gate position 500C, to the intermediate position 400B (550 in FIG. 6), and subsequently moving together the gate connector 330, the first gate 310, and the second gate 320 vertically downward to an open gate position 400A (560 in FIG. 6 which is similar to 460 in FIG. 5), where both the first gate 310 and the second gate 320 are open. In this embodiment, method 500 may further include decompressing an o-ring on the second gate 320 (not shown) and/or an o-ring on the second side 322 (not shown) prior to moving the gate connector 330, the first gate 310, and the second gate 320 horizontally from the second sealed gate position 500C (540 in FIG. 6).

In certain embodiments, at the open position 400A, a horizontal actuator 425, that is configured to provide horizontal motion to the first gate 310, second gate 320, and gate connector 330, is retracted. At the open position 400A, a vertical actuator 445, that is configured to provide vertical motion to the first gate 310, second gate 320, and gate connector 330, is extended. At the intermediate position 400B, the horizontal actuator 425 is still retracted and the vertical actuator 445 is in the middle (i.e., between an extended position and a retracted position). At the second sealed gate position 500C, the horizontal actuator 425 is extended and the vertical actuator 445 remains in the middle.

In an exemplary embodiment, the first station is a transfer chamber 648 and the second station is a processing chamber 655. During regular processing, wafers 101 and/or other objects may be transferred from the transfer chamber 648 to the processing chamber 655 through a first slot 314 in a first side 312 separating the transfer chamber 648 from the port 675 and through a second slot 324 in a second side 322 separating the processing chamber 655 from the port 675. During wafer transfer between the transfer chamber 648 and the processing chamber 655, the gate connector 330, the first gate 310, and the second gate 320 may be in an open position 400A. During processing, after a wafer is transferred from a transfer chamber 648 into a processing chamber 655, the gate connector 330, the first gate 310, and the second gate 320 may move together vertically upwards from an open position 400A to an intermediate position 400B. Thereafter, the gate connector 330, the first gate 310, and the second gate 320 may move together horizontally to a second sealed gate position 500C in which the second gate 320 seals against the second slot 324 on the second side 322 separating the processing chamber 655 from the port 675. The movement of the gate connector 330, the first gate 310, and the second gate 320 may be controlled by a single actuator 340 (e.g., as detailed with respect to FIG. 2). The second gate 320 in this example may be an L-motion gate. The L-motion gate may be used to seal the processing chamber 655 during wafer processing. In the second sealed gate position 500C, the first gate 310 is not being used and may be removed, replaced, cleaned, and/or serviced. Servicing may also include, removing broken pieces of wafers from a transfer chamber 648 or the port housing, cleaning the sealing surface of a port on the transfer chamber side, cleaning the interior of the transfer chamber 648, removing or replacing or cleaning an o-ring on the first gate or on the transfer chamber side that is used for sealing the first gate against the transfer chamber side.

After a certain number of hours of operation of the processing chamber or in accordance with a servicing schedule (e.g., monthly), the processing chamber 655 may be due for servicing and/or maintenance. For servicing and/or maintaining the processing chamber 655, the gate connector 330, the first gate 310, and the second gate 320 may move together to a first sealed gate position 400C in which the first gate 310 seals against the first slot 314 on the first side 312 separating the transfer chamber 648 from the port 675. To reach the first sealed gate position 400C from an open gate position 400A, the gate connector 330, the first gate 310, and the second gate 320 move together vertically upwards from an open position 400A to an intermediate position 400B. Subsequently, the gate connector 330, the first gate 310, and the second gate 320 move together vertically upward again from the intermediate position 400B to the first sealed gate position 400C. The movement of the gate connector 330, the first gate 310, and the second gate 320 may be controlled by an actuator 340 (e.g., as detailed with respect to FIG. 2). The first gate 310 in this example may be a vertical motion gate. In the first sealed gate position 400C, the second gate 320 is not being used and may be removed, replaced, cleaned and/or serviced. During this time, the processing chamber 655 may also be serviced. Servicing may include, removing broken pieces of wafers from a processing chamber 655 or the port housing, cleaning the sealing surface of a port on the processing chamber side, cleaning the interior of the processing chamber 655, removing or replacing or cleaning an o-ring on the second gate or on the processing chamber side that is used for sealing the second gate against the processing chamber side.

The ability to maintain and/or service one gate when the other gate is closed is beneficial as it allows to continue regular wafer processing in at least one of the chambers, while minimizing downtime of the wafer processing system, that would otherwise be associated with pressure adjustments (e.g., pumping down to vacuum) in the various stations.

The exemplary embodiment hereinabove was described with respect to a system of a processing chamber 655 and a transfer chamber 648, where the processing chamber 655 may be sealed with an L-motion type gate (having vertical and horizontal motion) and the transfer chamber 648 may be sealed with a vertical only motion type gate (e.g., vertical motion gate). However, this exemplary embodiment should not be construed as limiting. The dual gate system may be used in ports between any adjacent stations in a wafer processing system, such as, front opening unified pods (FOUP), side storage pod (SSP), load lock, transfer chamber, factory interface, processing chamber, vacuum storage buffer, and the like. Additionally, the positioning of the gate that is moveable in a vertical and horizontal motion to seal should not be construed as limited, so long as one gate is moveable in this manner and the other gate is moveable in a vertical motion.

In one embodiment, the L-motion type gate may seal the processing chamber and the vertical motion type gate may seal the transfer chamber. In another embodiment, the L-motion type gate may seal the transfer chamber and the vertical motion type gate may seal the processing chamber. Generally, an L-motion type gate generates less shear upon sealing and would be the preferred gate for gates that are utilized more frequently during wafer processing.

Some exemplary actuation mechanisms that may be used to implement vertical and/or horizontal movement of the dual gate system may include, without limitations, a single stroke pneumatic cylinder, a four bar mechanism, cam-over type motion, a servo or stepper motor, a dual stroke pneumatic cylinder, to name a few.

The wafer processing system described herein may be computer-controlled by a control unit (not shown). By executing programs (software) for processing wafer 101 based on predetermined recipes, various driving units of the substrate processing system operate and process wafer 101.

Further, it is to be understood that the methods disclosed herein may be attained by supplying to a computer (e.g., a control unit) a storage medium in which a program code of software that realizes the functions of the aforementioned embodiments is stored, and then causing a processor (e.g., a central processing unit (CPU)) of the computer to read out and execute the program code stored in the storage medium. Alternatively another type of processing device such as a programmable logic controller (PLC), a system on a chip (SoC), etc. may execute the program code. The processor or processing device executing the program code may cause ionizers to activate, slit valves to open and/or close, inert gas to flow or stop flowing at set flow rates, wafers to be moved between locations by robots, and so on.

In this case, the program code itself read out from the storage medium realizes the functions of the aforementioned embodiments and, hence, the program code and the storage medium in which the program code is stored are also part of the disclosure.

Moreover, the storage medium for Supplying the program code may be, e.g., an RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+RW) or the like, a magnetic tape, a non-volatile memory card, another ROM or the like. Alternatively, the program code may be supplied to the computer by downloading from another computer (not shown), a database (not shown) or the like connected to the Internet, a commercial network, an LAN (local area network) or the like.

Besides, it is to be understood that the functions of the aforementioned embodiments may be accomplished not only by executing the program code read out by the computer, but also by causing an OS (operating system) or the like that operates on the processing device to perform a part or all of the actual operations based on instructions of the program code.

The program codes may take the form of an object code, a program code executed by an interpreter, script data supplied to an OS, or the like.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

Embodiments of the present disclosure have been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

What is claimed is:

1. A dual gate system, comprising:
a first gate configured to form a first seal against a first slot;
a second gate configured to form a second seal against a second slot that is opposite the first slot;
a gate connector coupled to the first gate and the second gate; and
an actuator coupled to the gate connector, wherein the actuator is configured to:
seal the first gate against the first slot by moving the gate connector, the first gate, and the second gate together to an intermediate position, and then moving the gate connector, the first gate, and the second gate together vertically to a first sealed gate position, wherein to open the first gate from the first sealed gate position, the actuator is configured to move the gate connector, the first gate, and the second gate together downward from the first sealed gate position, past the intermediate position, to an open gate position; and
seal the second gate against the second slot by moving the gate connector, the first gate, and the second gate together to the intermediate position, and then moving the gate connector, the first gate, and the second gate together horizontally to a second sealed gate position, wherein to open the second gate from the second sealed gate position, the actuator is configured to move the gate connector, the first gate, and the second gate together horizontally from the second sealed gate position to the intermediate position, and to subsequently move the gate connector, the first gate, and the second gate together downward to the open gate position, wherein both the first gate and the second gate are open in the open gate position.

2. The port of claim 1, wherein the first gate is a MonoVat gate and the second gate is an L-motion gate.

3. The port of claim 1, wherein the actuator is configured to close the first gate by moving the gate connector, the first gate, and the second gate together in an upward direction to the first sealed gate position, and wherein upward movement of the first gate to the first sealed gate position causes one or more o-ring on at least one of the first gate or a first side comprising the first slot to become compressed between the first gate and the first side.

4. The port of claim 1, wherein to open a sealed first gate the actuator is configured to:
move the gate connector, the first gate, and the second gate downward from the first sealed gate position, past the intermediate position, to an open gate position.

5. The port of claim 4, wherein both the first gate and the second gate are open in the open gate position.

6. The port of claim 1, wherein to open a sealed second gate the actuator is configured to:
move the gate connector, the first gate, and the second gate horizontally from the second sealed gate position to the intermediate position, and to subsequently move the gate connector, the first gate, and the second gate downward to an open gate position.

7. The port of claim 6, wherein both the first gate and the second gate are open in the open gate position.

8. The port of claim 1, wherein the first gate and the second gate are both removable from the gate connector.

9. A method comprising:
moving together a first gate, a second gate, and a gate connector coupled to the first gate and to the second gate from an open gate position to an intermediate position; and then
either:
moving together the gate connector, the first gate, and the second gate vertically to a first sealed gate position, the first sealed gate position comprising a first seal against a first slot on a first side of a housing containing the first gate, the second gate, and the gate connector, wherein to open the first gate from the first sealed gate position, moving together the gate connector, the first gate, and the second gate together downward from the first sealed gate position, past the intermediate position, to an open gate position, or moving together the gate connector, the first gate, and the second gate horizontally to a second sealed gate position, the second sealed gate position comprising a second seal against a second slot on a second side of the housing, wherein the second side is opposite to the first side, wherein to open the second gate from the second sealed gate position, moving together the gate connector, the first gate, and the second gate together horizontally from the second sealed gate position to the intermediate position, and to subsequently moving together the gate connector, the first gate, and the second gate together downward to the open gate position, wherein both the first gate and the second gate are open in the open gate position.

10. The method of claim 9, further comprising compressing one or more o-ring on at least one of the first gate or the first side between the first gate and the first side at the first sealed gate position.

11. The method of claim 9, further comprising compressing one or more o-ring on at least one of the second gate or the second side between the second gate and the second side at the second sealed gate position.

12. A wafer processing system, comprising:
a first station;
a second station adjacent to the first station; and
a port positioned between the first station and the second station, the port comprising:
  a housing having a first side and a second side that is opposite the first side, the housing comprising a first slot at the first side and a second slot at the second side, wherein objects are transferrable between the first station and the second station through the port via the first slot and the second slot; and
  a dual gate system housed within the housing, the dual gate system comprising:
    a first gate configured to form a first seal against the first slot;
    a second gate configured to form a second seal against the second slot;
    a gate connector coupled to the first gate and the second gate; and
    an actuator coupled to the gate connector,
  wherein the actuator is configured to:
    seal the first gate against the first slot by moving the gate connector, the first gate, and the second gate together to an intermediate position, and then moving the gate connector, the first gate, and the second gate together vertically to a first sealed gate position, wherein to open the first gate from the first sealed gate position, the actuator is configured to move the gate connector, the first gate, and the second gate together downward from the first sealed gate position, past the intermediate position, to an open gate position; and
    seal the second gate against the second slot by moving the gate connector, the first gate, and the second gate together to the intermediate position, and then moving the gate connector, the first gate, and the second gate together horizontally to a second sealed gate position, wherein to open a second gate from the second sealed gate position, the actuator is configured to move the gate connector, the first gate, and the second gate together horizontally from the second sealed gate position to the intermediate position, and to subsequently move the gate connector, the first gate, and the second gate together downward to the open gate position, wherein both the first gate and the second gate are open in the open gate position.

13. The wafer processing system of claim 12, wherein the first gate and the second gate are both removable from the gate connector, and wherein the first gate is a MonoVat gate and the second gate is an L-motion gate.

14. The wafer processing system of claim 12,
wherein the actuator is configured to close the first gate by moving the gate connector, the first gate, and the second gate together in an upward direction to the first sealed gate position, and wherein upward movement of the first gate to the first sealed gate position causes one or more o-ring on at least one of the first gate or the first side to become compressed between the first gate and the first side, and
wherein the actuator is configured to close the second gate by moving the gate connector, the first gate, and the second gate together in a horizontal direction towards the second side to the second sealed gate position, and wherein horizontal movement of the second gate to the second sealed gate position causes one or more o-ring on at least one of the second gate or the second side to become compressed between the second gate and the second side.

15. The wafer processing system of claim 12, wherein the first station and the second station are, independently, one of: a load lock, a transfer chamber, a processing chamber, a front opening unified pods (FOUP), a side storage pod (SSP), vacuum storage buffer.

16. The wafer processing system of claim 12, wherein the first station is a transfer chamber and the second station is a processing chamber.

* * * * *